(12) United States Patent
Sumikawa et al.

(10) Patent No.: US 11,150,281 B2
(45) Date of Patent: Oct. 19, 2021

(54) ELECTRIC POWER MEASUREMENT

(71) Applicant: LENOVO (Singapore) PTE. LTD., New Tech Park (SG)

(72) Inventors: Toshinari Sumikawa, Yokohama (JP); Takuo Yamagishi, Yokohama (JP)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 120 days.

(21) Appl. No.: 16/558,979

(22) Filed: Sep. 3, 2019

(65) Prior Publication Data

US 2020/0072880 A1 Mar. 5, 2020

(30) Foreign Application Priority Data

Sep. 3, 2018 (JP) .............................. JP2018-164833

(51) Int. Cl.
*G01R 27/08* (2006.01)
*G01R 21/06* (2006.01)
*G01R 19/00* (2006.01)

(52) U.S. Cl.
CPC .......... *G01R 21/06* (2013.01); *G01R 19/0038* (2013.01)

(58) Field of Classification Search
CPC .... G01R 21/133; G01R 21/007; G01R 15/18; G01R 15/09; G01R 15/125; G01R 15/08; G01R 15/002; G01R 11/24; G01R 11/04; G01R 11/02; G01R 11/56; G01R 11/36; G01R 11/57; G01R 11/58; G01R 1/36; G01R 1/30; G01R 1/02; G01R 13/04; G01R 13/02; G01R 31/36886; G01R 31/3682; G01F 15/06; G01F 15/063

See application file for complete search history.

(56) References Cited

U.S. PATENT DOCUMENTS

| 2007/0262763 A1* | 11/2007 | Suzuki | H02M 3/156 323/284 |
| 2009/0134857 A1* | 5/2009 | Zeng | H02M 3/156 323/282 |
| 2011/0208468 A1* | 8/2011 | Yamamoto | H02J 13/00034 702/118 |

(Continued)

FOREIGN PATENT DOCUMENTS

| JP | S62-193571 A | 12/1987 |
| JP | S63277978 A | 11/1988 |

(Continued)

*Primary Examiner* — Thang X Le
(74) *Attorney, Agent, or Firm* — Kunzler Bean & Adamson

(57) ABSTRACT

An information processing device, a method and computer program product are disclosed. The information processing device includes a component, a resistance unit, and a measurement unit that measures a voltage drop of the resistance unit, wherein the resistance unit is connected on an electric power line. The method includes providing electric power to a component, adjusting a resistance unit based on an operating state of a control unit, and measuring a voltage drop of the resistance unit with a measurement unit. The computer program product includes executable code to perform providing electric power to a component; adjusting a resistance unit based on an operating state of a control unit, and measuring a voltage drop of the resistance unit with a measurement unit.

20 Claims, 6 Drawing Sheets

(56) References Cited

U.S. PATENT DOCUMENTS

| | | | |
|---|---|---|---|
| 2013/0113507 A1* | 5/2013 | Danesh | G01R 21/14 |
| | | | 324/713 |
| 2016/0266596 A1* | 9/2016 | Coutts | H01L 23/62 |
| 2018/0172734 A1* | 6/2018 | Borthwick | H02H 1/0007 |
| 2019/0064307 A1* | 2/2019 | Danesh | G01R 27/28 |

FOREIGN PATENT DOCUMENTS

| | | | |
|---|---|---|---|
| JP | 2009098079 A | 5/2009 |
| JP | 2011145959 A | 7/2011 |
| JP | 2012040748 A | 3/2012 |

\* cited by examiner

ELECTRIC POWER MEASUREMENT

CROSS-REFERENCE TO RELATED APPLICATIONS

This patent application claims priority to Japan Patent Application No. 2018-164833 filed on Sep. 3, 2018 for Toshinari Sumikawa et al., the entire contents of which are incorporated herein by reference for all purposes.

FIELD

The present invention relates to an information processing device, a control method, and a computer program product.

BACKGROUND

Some information processing devices and methods include a measurement instrument that measures power consumption of a component of the information processing device. Sometimes, this is performed by measuring a voltage drop across a resistor with a known resistance that is provided on an electric power line for supplying electric power to a component. However, the component may be damaged, or the accuracy of measurement may be reduced.

BRIEF SUMMARY

An information processing device comprises a component, a resistance unit having a variable resistance value, and a measurement unit that measures a voltage drop of the resistance unit, wherein the resistance unit is connected on an electric power line for supplying electrical power to the component.

A control method for an information processing device comprises providing electric power to a component via an electric power line, adjusting a resistance unit located on the electric power line that has a variable resistance value based on an operating state of a control unit that controls operation of the information processing device, and measuring a voltage drop of the resistance unit with a measurement unit.

A computer program product comprises a non-transitory computer readable storage medium that stores code executable by a processor, the executable code comprising code to providing electric power to a component via an electric power line; adjusting a resistance unit located on the electric power line that has a variable resistance value based on an operating state of a control unit that controls operation of the information processing device, and measuring a voltage drop of the resistance unit with a measurement unit.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

To measure electrical power usage, it is desirable that the resistance value of the detection resistor is small when the component is operating. The larger the resistance value of the detection resistor is, the higher the voltage drop that is generated across the detection resistor, and the voltage that is provided to the component becomes relatively lower. This may harm the operation of the component. In order to avoid a negative impact on the operation of the component, it is desired to make the voltage drop in the detection resistor sufficiently smaller than that in the component (for example, less than 10% of the voltage drop in the component). On the other hand, it is desirable that the resistance value of the detection resistor is large when the operating state of the component is a sleep state. This is so because when the resistance value of the detection resistor is small, the voltage drop that is generated in the detection resistor is also small and measurement error tends to become larger. In order to detect the voltage drop or power consumption in the component with sufficient accuracy, it is desirable to make the voltage drop of the detection resistor larger than a predetermined reference value (for example, 1.0 mV). The present subject matter solves the above-described problem, and can reduce a measurement error in a voltage drop without affecting the operation of the component by setting a resistance value corresponding to the operating state of the component.

The first exemplary embodiment of the present invention will be described with reference to the drawings. In the following description, the case where an information processing device 1 is mainly a Laptop PC will be considered. However, the information processing device 1 is not limited to a Laptop PC, but may be realized in any form, such as a desktop PC, a tablet terminal device, or a smart hone.

Figure 1:
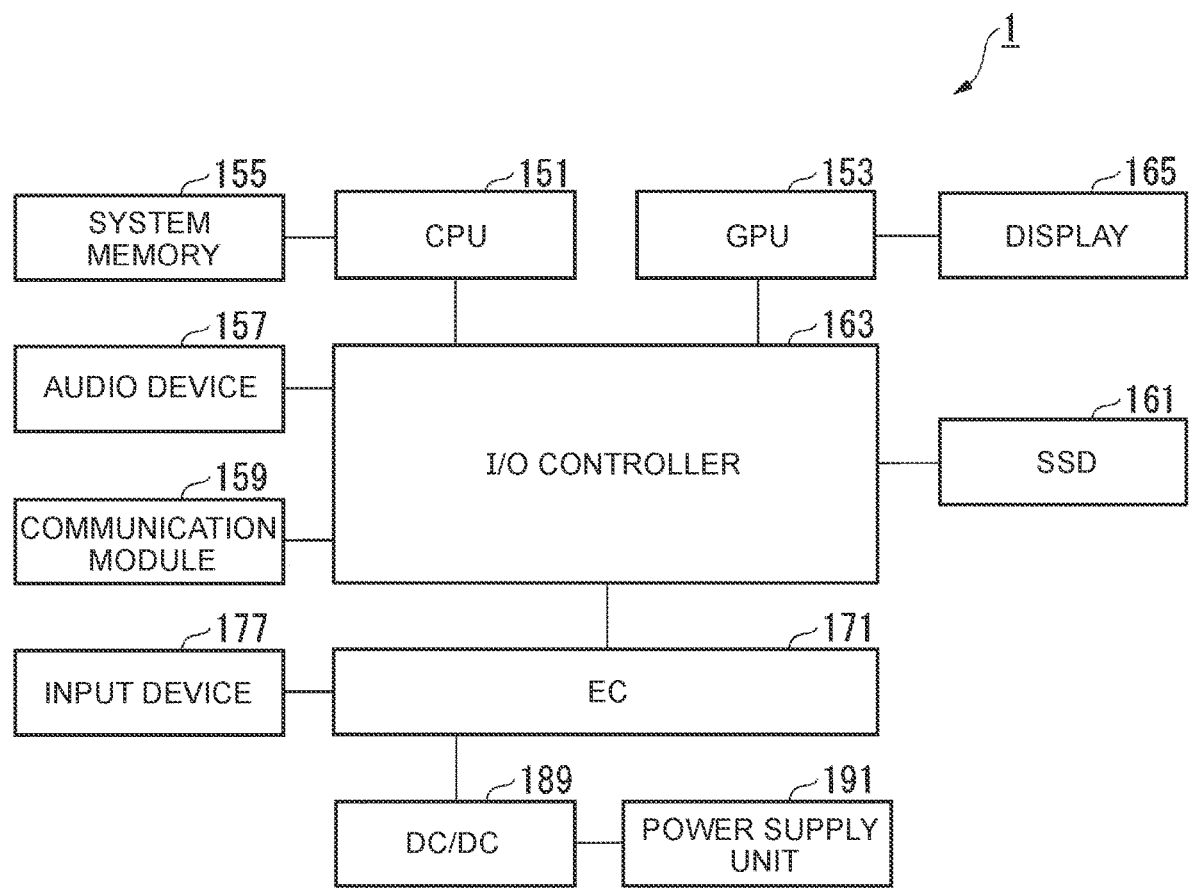
FIG. 1 is a schematic block diagram illustrating a hardware configuration example of an information processing device according to the first embodiment.

FIG. 1 is a schematic block diagram illustrating a hardware configuration example of the information processing device 1 according to an embodiment of the present invention.

The information processing device 1 includes system devices and peripheral devices. The system devices of the information processing device 1 include a Central Processing Unit (CPU) 151, a Graphics Processing Unit (GPU) 153, a system memory 155, and an Input Output (I/O) controller 163. The system memory 155 and the I/O controller 163 are connected to the CPU 151. A display 165 and the I/O controller 163 are connected to the GPU 153. The CPU 151, the GPU 153, an audio device 157, a communication module 159, a Solid State Drive (SSD) 161, and an Embedded Controller (EC) 171 are connected to the I/O controller 163.

The audio device 157 includes one or both of a speaker and a microphone, for example. The communication module 159 communicatively connects to other devices. The communication module 159 is, for example, a wireless module that connects to other devices using a predetermined wireless communication system.

The SSD 161 stores various data. The SSD 161 stores data that is used for the operation of the system device and data that is acquired by the operation of the system device. The data that is stored in the SSD 161 can be erased and updated.

The EC 171 is a microcomputer that includes a processor, a storage medium, and a programmable logic circuit. This processor may be a CPU that is different from the CPU 151, for example. The storage medium may be a Read Only Memory (ROM) or a Random Access Memory (RAM) is included, for example. The EC 171 operates independently of the CPU 151 and mainly controls the inside of the information processing device 1 or a surrounding operating environment.

The processor of the EC 171 reads a control program previously stored in the ROM and performs processing that is instructed by various instructions described in the read control program to perform a part or all of functions of each unit that will be described later. In the present embodiment, performing processing that is instructed by instructions described in various programs may be referred to as "executing the program," but it is not limited to being performed by the EC 171. In addition, starting the execution may be referred to as "activation."

An input device 177, a signal line of a Direct Current/Direct Current (DC/DC) converter 189, and a signal line of a power supply unit 191 are connected to the EC 171. The DC/DC converter 189 operates under control of the EC 171, converts a voltage of electric power that is supplied from the power supply unit 191, and supplies electric power of a specified voltage to each component that forms the information processing device 1. The DC/DC converter 189 supplies electric power to each device in response to an instruction of a power control signal that is input from the EC 171. For example, when it is detected that an operation switch (not shown) provided in the information processing device 1 is held down, the EC 171 determines that the information processing device 1 should be started and outputs power control signals indicating supply of electric power to each device, to the DC/DC converter 189.

In addition, event information may be input from the CPU 151 to the EC 171 via the I/O controller 163. When the input event information indicates a transition from a standard mode to a sleep mode as an operation mode of the system of the information processing device 1, the EC 171 outputs a power control to the DC/DC converter 189 signal indicating a decrease in a power supply amount to a predetermined component. When the power control signal is received from the EC 171, the DC/DC converter 189 decreases the power supply amount to the component. The decrease in the power supply amount lowers the level of activity in the operating state of the component. The EC 171 may stop power supply to some components, for example, the display 165 and the audio device 157. Note that examples of operation modes will be described later.

On the other hand, when event information indicating a transition from the sleep mode to the standard mode is input from the CPU 151, the EC 171 outputs a power control signal to the DC/DC converter 189 indicating an increase in a power supply amount to a predetermined component. When the power control signal is sent from the EC 171, the DC/DC converter 189 increases the power supply amount to the predetermined component. The increase in the power supply amount raises the level of activity in the operating state of the component. The EC 171 may resume the supply of electric power to the component to which the supply of electric power was cut off in the sleep mode.

The power supply unit 191 supplies electric power to the DC/DC converter 189. The power supply unit 191 includes an Alternating Current/Direct Current (AC/DC) adaptor, a battery, and a battery charger (not shown). The AC/DC adaptor converts alternating-current power that is supplied from a commercial power supply into direct-current power. The AC/DC adaptor supplies the converted direct-current power to the DC/DC converter 189 and the battery charger. The battery charger controls charging of electric power that is supplied from the AC/DC adaptor in the battery under the control of the EC 171. The battery charger charges the battery with the remaining electric power of the supplied electric power. The battery accumulates the electric power that is supplied from the battery charger. The battery may be a lithium-ion battery, for example. When no electric power is supplied from the AC/DC adaptor or the electric power to be supplied to the information processing device 1 is insufficient, the battery discharges the accumulated electric power and supplies it to the DC/DC converter 189. The power supply unit 191 may be fixed in the chassis of the information processing device 1 or may include a mechanism that is attachable to and detachable from the chassis of the information processing device 1.

The CPU 151 consumes electric power that is supplied from the DC/DC converter 189. The CPU 151 typically has variable processing power, and the higher the processing power is, the greater the power consumption is. As a measure of the processing power, an operating frequency or a usage rate, etc., is used.

The CPU 151 runs an Operating System (OS) and other programs. The CPU 151 may make an operation mode changeable depending on a processing state up to that point and take any one of a plurality of operation modes. Typically, power consumption differs from operation mode to operation mode in accordance with the processing power. The operation mode that may be used by the CPU 151 may include a standard mode and a sleep mode, for example. The standard mode is a standard operation mode that processes common tasks using a predetermined standard processing power. The common tasks include processing that is instructed directly or indirectly by the OS and processing that is instructed directly or indirectly by software, the start-up of which is instructed by user's operation or user-optional setting.

The sleep mode is an operation mode in which power consumption is lower than in the standard mode. Since the sleep mode is an operation mode in which processing power is lower than in the standard mode, it is also referred to as an idle mode. In the present embodiment, the sleep mode does not necessarily involve a complete stop of the operation of the CPU 151. Since user operations are not typically performed in the sleep mode, operation of the component in response to the user's operation is not expected. A condition for the transition from the standard mode to the sleep mode may be, for example, a state where input of an operation signal from the input device 177 is not detected continues for a predetermined time (for example, 3 to 5 minutes) or more. A condition for the transition from the sleep mode to the standard mode may be, for example, the input of an operation signal from the input device 177 is detected.

Measurement System

Figure 2:
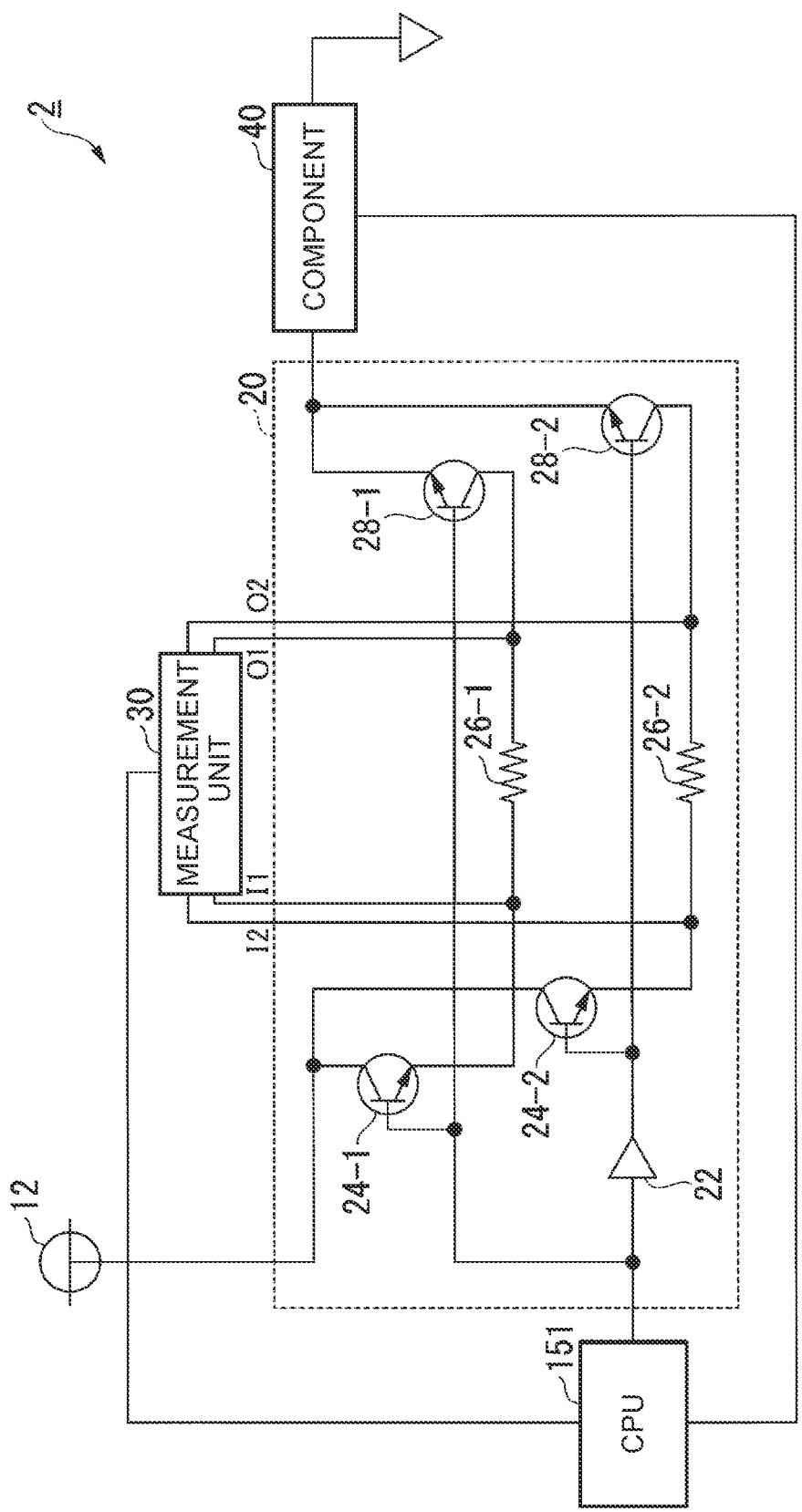
FIG. 2 is a schematic block diagram illustrating a configuration example of a measurement system according to the first embodiment.

Next, a measurement system 2 that measures power consumption of each component of the information processing device 1 will be described. FIG. 2 is a schematic block diagram illustrating a configuration example of the measurement system 2 according to the present embodiment. The measurement system 2 includes a power supply unit 12, a resistance unit 20, a component 40, and the CPU 151.

The power supply unit 12 supplies electric power required for operation to the component 40. The above-described DC/DC converter 189 corresponds to the power supply unit 12. The resistance unit 20 is installed on an electric power line for supplying electric power from the power supply unit 12 to the component 40. The electric power line is also referred to as a bus. Electrical resistance of the resistance unit 20 is variable as described later.

A measurement unit 30 is connected to the resistance unit 20 in parallel and measures a voltage drop that is generated across the resistance unit 20 in response to current flowing through the electric power line. The voltage drop is also referred to as a potential difference. The measurement unit 30 can calculate a current value of the current flowing through the electric power line from the measured voltage drop and a resistance value of the resistance unit 20. The measurement unit 30 can calculate the power consumption of the component 40 by multiplying the voltage drop by the current value. The measurement unit 30 outputs measurement information indicating any of the measured voltage drop, the calculated current value, and the power consumption, or any combination thereof, to the CPU 151. The measurement unit 30 may be formed as a chipset. For example, an Energy Estimation Engine (E3) can be used as the measurement unit 30.

The component 40 is a component that forms part of the information processing device 1, the voltage drop of which is to be measured. For example, any of the audio device 157, the communication module 159, and the SSD 161, or any combination thereof may correspond to the component 40. Operation of these members is controlled by the CPU 151. The component 40 may include another member, for example, any of the CPU 151, the GPU 153, the system memory 155, and the display 165, or any combination thereof.

Note that when the operation mode is the standard mode, the component 40 is likely to operate in a standard operating state. On the contrary, when the operation mode is the sleep mode, the component 40 is expected to not operate at all, or is expected to operate in an operating state in which the level of activity is lower than in the standard operating state. Thus, the CPU 151 controls the resistance value of the resistance unit 20 in accordance with the operation mode. In other words, the resistance unit 20 sets a resistance value in accordance with the operation mode.

In one example, the CPU 151 outputs to the resistance unit 20 an SLP_S0# as a control signal indicating the operation mode at that time. The SLP_S0# is an electrical signal indicating whether or not the operation mode is a sleep mode in an S0 state defined by an Advanced Configuration and Power Interface (ACPI). The S0 state indicates a state where the CPU 151 operates. The SLP_S0# has any of a high voltage value (H) and a low voltage value (L) as a voltage value. The high voltage value is a positive voltage value that is significantly higher than 0V and indicates the standard mode. The low voltage value is a positive voltage value that is sufficiently closer to 0V than the high voltage value and indicates the sleep mode.

Next, a configuration example of the resistance unit 20 will be described.

The resistance unit 20 includes a voltage regulator 22, switch units 24-1, 24-2, 28-1, and 28-2, and resistors 26-1 and 26-2. The voltage regulator 22 has one end that is connected to the CPU 151 and the other end that is connected to base electrodes of the switch units 24-2 and 28-2. The voltage regulator 22 regulates a voltage of a control signal that is supplied from the CPU 151 via its one end, and applies the control signal with the voltage regulated from its another end to each base electrode of the switch units 24-2 and 28-2. The regulated voltage for a high voltage value will be, for example, a negative voltage value that is lower than 0V. The regulated voltage for a low voltage value will be, for example, a positive voltage value that is significantly higher than 0V.

The resistors 26-1 and 26-2 have resistance values R1 and R2, respectively. In the example shown in FIG. 2, the resistance value R1 is much smaller than the resistance value R2.

An NPN type transistor is used for each of the switch units 24-1, 24-2, 28-1, and 28-2. The NPN type transistor typically has a base electrode, a collector electrode, and an emitter electrode. The NPN type transistor conducts current from the collector electrode to the emitter electrode when a positive voltage that is significantly higher than 0V (hereinafter referred to as a positive voltage) is applied to the base electrode, and blocks the current from the collector electrode to the emitter electrode when another voltage (hereinafter referred to as a non-positive voltage) is applied. The switch units 24-1, 24-2, 28-1, and 28-2 are connected so that when the positive voltage is applied to each base electrode thereof, the current that is supplied from the power supply unit 12 passes via each collector electrode and emitter electrode. Then, when a positive voltage is applied to the base electrodes of the switch units 24-1 and 28-1, a non-positive voltage is applied to each base electrode of the switch units 24-2 and 28-2, and thus the current from the power supply unit 12 does not pass through the resistor 26-2 but passes through the resistor 26-1 to be supplied to the component 40. On the other hand, when a positive voltage is applied to the base electrodes of the switch units 24-2 and 28-2, a non-positive voltage is applied to the base electrodes of the switch units 24-1 and 28-1, and thus the current flowing from the power supply unit 12 through the electric power line does not pass through the resistor 26-1 but passes through the resistor 26-2 to be supplied to the component 40.

Therefore, the base electrode of the switch unit 24-1 is connected to the CPU 151, the collector electrode thereof is connected to the power supply unit 12, and the emitter electrode thereof is connected to one end of the resistor 26-1 and a first input end I1 of the measurement unit 30, respectively.

The base electrode of the switch unit 24-2 is connected to one end of the voltage regulator 22, the collector electrode thereof is connected to the power supply unit 12, and the emitter electrode thereof is connected to one end of the resistor 26-2 and a second input end I2 of the measurement unit 30, respectively.

The base electrode of the switch unit 28-1 is connected to the CPU 151, the collector electrode thereof is connected to the other end of the resistor 26-1 and a first output end O1 of the measurement unit 30, and the emitter electrode thereof is connected to the component 40, respectively.

The base electrode of the switch unit 28-2 is connected to the CPU 151, the collector electrode thereof is connected to the other end of the resistor 26-2 and a second output end O2 of the measurement unit 30, and the emitter electrode thereof is connected to the component 40, respectively.

That is, the electric power line for supplying electric power from the power supply unit 12 to the component 40 is branched into a first route and a second route. The first route is a route that passes through the collector electrode of the switch unit 24-1, the emitter electrode of the switch unit 24-1, the one end of the resistor 26-1, the other end of the resistor 26-1, the collector electrode of the switch unit 28-1, and the emitter electrode of the switch unit 28-1. The second route is a route that passes through the collector electrode of the switch unit 24-2, the emitter electrode of the switch unit 24-2, the one end of the resistor 26-2, the other end of the resistor 26-2, the collector electrode of the switch unit 28-2, and the emitter electrode of the switch unit 28-2. Then, either the first route or the second route is properly used as a route for the current from the power supply unit 12 to flow, depending on whether the operation mode is the standard mode or not.

The measurement unit 30 includes a first measurement channel that measures a first voltage drop V1 between the first input end I1 and the first output end O1 and a second measurement channel that measures a second voltage drop V2 between the second input end I2 and the second output end O2. Since the first measurement channel and the second measurement channel are in parallel with the resistor 26-1 and the resistor 26-2, respectively, they can measure the voltage drops in the resistors 26-1 and 26-2, respectively.

Therefore, when the operation mode of the CPU 151 is the standard mode, the current from the power supply unit 12 is supplied to the component 40 via the switch unit 24-1, the resistor 26-1, and the switch unit 28-1. At this time, the measurement unit 30 can measure the voltage drop that is generated across the resistor 26-1 as a first voltage drop when the current flows via the resistor 26-1.

When the operation mode of the CPU 151 is the sleep mode, the current from the power supply unit 12 is supplied to the component 40 via the switch unit 24-2, the resistor 26-2, and the switch unit 28-2. At this time, the measurement unit 30 can measure the voltage drop that is generated across both ends of the resistor 26-2 as a second voltage drop when the current flows via the resistor 26-2.

Then, when the operation mode of the CPU 151 is the standard mode or the sleep mode, the operating state of the component 40 is expected to be in operation (active) or out of service (sleep), respectively. Thus, it is possible to resolve an operation failure due to a change in the voltage drop that is generated in the resistance unit 20 when the component 40 is in operation and the reduction in measurement accuracy due to the voltage drop that is generated in the resistance unit 20 being small when the component 40 is out of service.

Note that the measurement unit 30 may specify a measurement channel corresponding to the operation mode that is indicated by the control signal input from the CPU 151. When the standard mode is indicated by the control signal, the measurement unit 30 selects the second measurement channel. When the sleep mode is indicated by the control signal, the measurement unit 30 selects the first measurement channel. The measurement unit 30 measures a voltage drop with the selected measurement channel and outputs measurement information indicating the measured voltage drop to the CPU 151. The measurement information may include either or both of the currents that are calculated from the measured voltage drop and the power consumption that is calculated from the current and voltage drop.

Measurement Example

Next, an example of measurement of the voltage drop that is generated in the resistance unit 20 will be described using FIG. 3. In this example, the resistance values R1 and R2 that the resistance unit 20 can have are 1.0[Ω] and 0.01[Ω], respectively, the voltage of the power supply unit 12 is 3.3[V], and when the operating state of the component 40 is active and sleep, the power consumption is 1.0[W] and 3 [mW], respectively.

Figure 3A:
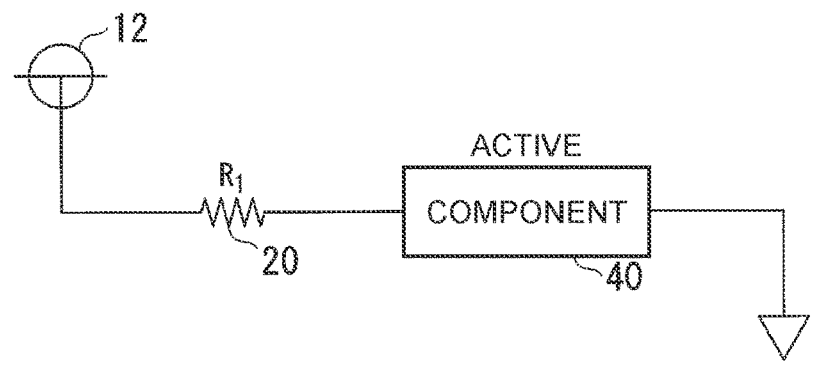
FIGS. 3A to 3D are explanatory diagrams illustrating an example of a voltage drop that is generated in a resistance unit according to the first embodiment.

FIG. 3A illustrates the case where the resistance value of the resistance unit 20 is R1, and the operating state of the component is active. In this example, the current flowing through the resistance unit 20 is 0.3[A] ($\approx$1.0/3.3). Thus, the voltage drop that is generated across both ends of the resistance unit 20 is 0.3[V] ($\approx$0.3×1.0). In light of the fact that the voltage drop by the component 40 is 3.3[V] ($\approx$1.0/0.3), the voltage drop that is generated across both ends of the resistance unit 20 can affect the operation of the component 40.

Figure 3B:
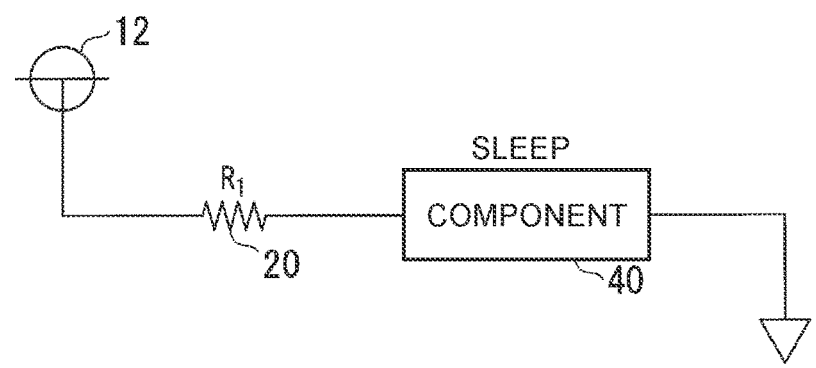

FIG. 3B illustrates the case where the resistance value of the resistance unit 20 is R1, and the operating state of the component is sleep. In this example, the current flowing through the resistance unit 20 is 0.9 [mA] ($\approx$3/3.3). Thus, the voltage drop that is generated across both ends of the resistance unit 20 is 0.9 [mV] ($\approx$0.9×1.0) and negligibly small compared to the voltage drop by the component 40.

Figure 3C:
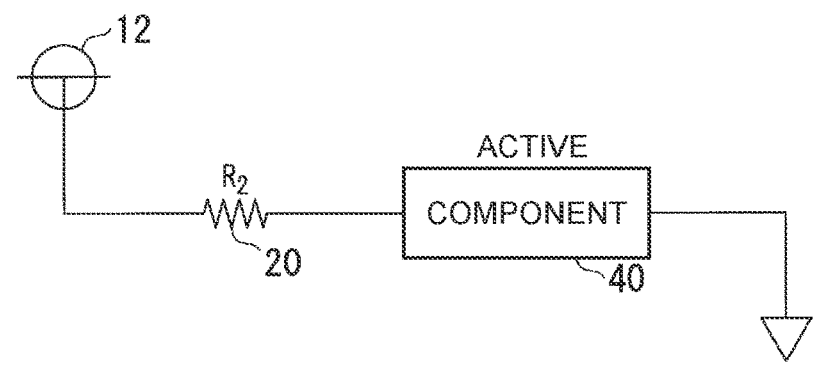

FIG. 3C illustrates the case where the resistance value of the resistance unit 20 is R2, and the operating state of the component is active. In this example, the current flowing through the resistance unit 20 is 0.3[A] ($\approx$1.0/3.3). Thus, the voltage drop that is generated across both ends of the resistance unit 20 is 3.0 [mV] ($\approx$0.3×0.01×1000). In light of the fact that the voltage drop by the component 40 is about 3.3[V] (=1.0/0.3), the voltage drop that is generated across both ends of the resistance unit 20 is negligibly small compared to the voltage drop by the component 40.

Figure 3D:
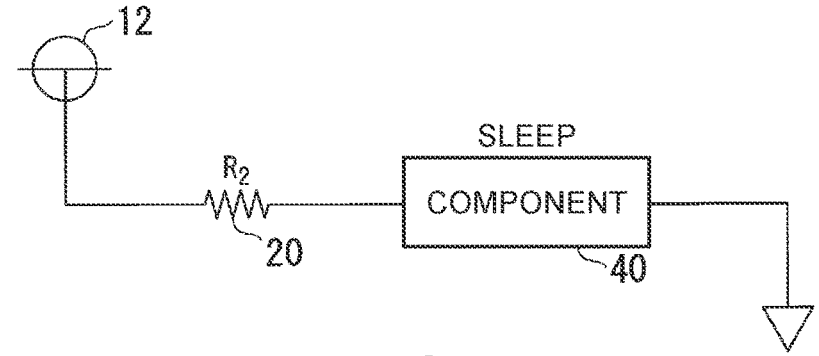

FIG. 3D illustrates the case where the resistance value of the resistance unit 20 is R2, and the operating state of the component 40 is sleep. In this example, the current flowing through the resistance unit 20 is 0.9 [mA] ($\approx$3/3.3). Thus, the voltage drop that is generated across both ends of the resistance unit 20 is 9[μV] ($\approx$0.9×0.01×1000), and thus the accuracy degrades. A measurement error in the voltage drop typically tends to become significant as the voltage drop becomes smaller. For example, when the voltage drop is 1 mV, the measurement error is about 1%.

As described above, in the information processing device 1 according to the present embodiment, when the operating state of the component 40 changes to the active state, the resistance value of the resistance unit 20 switches to R2 (FIG. 3C). When the operating state of the component 40 changes to the sleep state, the resistance value of the resistance unit 20 switches to R1 (FIG. 3B). Thus, a sufficiently large voltage drop that may affect the operation of the component 40 (FIG. 3A) is avoided. Additionally, a sufficiently small voltage drop that makes the measurement error significant (FIG. 3D) is also avoided.

Second Embodiment

The second embodiment of the present invention and mainly differences from the first embodiment will be described using FIG. 4. Elements that are common to those of the first embodiment are followed by common symbols and the description thereof is quoted.

The information processing device 1 according to the present embodiment includes a measurement system 2a (FIG. 4) in place of the measurement system 2 (FIG. 2). The measurement system 2a includes a resistance unit 20a in place of the resistance unit 20 (FIG. 2).

In addition to the first route and the second route described above, a third route is further provided in the resistance unit 20a. The third route is a route that runs via a switch unit 24-t and a switch unit 28-t. No resistor is provided on the third route. The CPU 151 controls whether or not to pass the current from the power supply unit 12 through the third route. This control controls whether or not to short-circuit between the power supply unit 12 and the component 40. Then, in short-circuiting between the power supply unit 12 and the component 40, the CPU 151 does not pass the current through but blocks the first route and the second route.

Unlike the resistance unit 20, the resistance unit 20a further includes an inverter 23, and switch units 24-t and 28-t. The inverter 23 has one end that is connected to the CPU 151 and the other end that is connected to each base electrode of the switch units 24-t and 28-t. The inverter 23 inverts a polarity of a measurement control signal that is input from its one end and applies the measurement control signal whose polarity is inverted to each base electrode of the switch units 24-t and 28-t.

The switch units 24-t and 28-t include an NPN type transistor. In this example, the third route runs via the collector electrode of the switch unit 24-t, the emitter electrode of the switch unit 24-t, the collector electrode of the switch unit 28-t, and the emitter electrode of the switch unit 28-t.

The measurement control signal whose polarity is inverted is applied to the base electrodes of the switch units 24-t and 28-t. The measurement control signal has, for example, any of a positive voltage value that is significantly higher than 0V and a negative voltage value that is significantly lower than 0V, as a voltage value. At the stage of being output from the CPU 151, the positive voltage value indicates the necessity of measurement. The negative voltage value indicates that measurement is unnecessary. Thus, when the positive voltage indicating that measurement is unnecessary is applied to each base electrode of the switch units 24-t and 28-t by inverting positive/negative of the potential by the inverter 23, the third route is energized. When the negative voltage indicating the necessity of measurement is applied to each base electrode of the switch units 24-t and 28-t, the third route will be blocked.

The resistance unit 20a further includes switch units 25-1 and 25-2. When the third route is blocked, the switch units 25-1 and 25-2 energize any of the first route and the second route, respectively. The switch units 25-1 and 25-2 block the first route and the second route when the third route is energized.

More specifically, each base electrode of the switch units 25-1 and 25-2 is connected to the CPU 151, and a measurement control signal is directly applied from the CPU 151 to each base electrode. Then, when a positive voltage indicating necessity of measurement is applied to each base electrode of the switch units 25-1 and 25-2, a path from each emitter electrode to each collector electrode of the switch units 25-1 and 25-2 can be energized. Note that the voltage regulator 22 regulates a voltage of a control signal indicating the operation mode from the CPU 151 and outputs a signal that is obtained by regulating the voltage to the emitter electrode of the switch unit 25-2.

Thus, when the control signal that is output from the CPU 151 has a high voltage value, a positive voltage by the control signal is applied from the emitter electrode of the switch unit 25-1 via the collector electrode to each base electrode of the switch units 24-1 and 28-1. In that case, a negative voltage is applied from the voltage regulator 22 via the emitter electrode and the collector electrode of the switch unit 25-2 to the base electrodes of the switch units 24-2 and 28-2. Therefore, the first route is energized but the second route is blocked.

On the other hand, when the control signal that is output from the CPU 151 has a low voltage value, a non-positive voltage that is close to 0V by the control signal is applied from the emitter electrode of the switch unit 25-1 via the collector electrode to each base electrode of the switch units 24-1 and 28-1. In that case, a positive voltage is applied from the voltage regulator 22 via the emitter electrode and the collector electrode of the switch unit 25-2 to the base electrodes of the switch units 24-2 and 28-2. Therefore, the first route is blocked but the second route is energized.

As described above, the CPU 151 determines whether measurement is necessary and outputs a measurement control signal indicating the necessity/unnecessity of measurement separately from the control signal indicating the operation mode. For example, the CPU 151 may determine the necessity/unnecessity of measurement by referring to schedule information indicating the necessity/unnecessity of measurement for every predetermined time zone. When commands pertaining to maintenance of the information processing device 1 are indicated by an operation signal that is received from the input device 177, the CPU 151 may determine that measurement is necessary. After a period during which those commands are not indicated continues for a specified time or longer, the CPU 151 may determine that measurement is unnecessary. The CPU 151 may display, for example, operating information indicating an operating condition of the system device or each component 40 on the display 165 in a predetermined form.

As described above, the resistance unit 20a short-circuits an electric power path from the power supply unit 12 to the component 40 when a voltage drop is not measured, in the present embodiment. Thus, when a voltage drop is not measured, unnecessary power consumption due to a detection resistor is avoided. For example, when the information processing device is in a sleep mode, it is possible to save electric power that is consumed by passage of the current through the resistance unit 20a.

Third Embodiment

The third embodiment of the present invention and mainly differences from the first embodiment will be described using FIG. 5. Elements that are common to those of the first embodiment are followed by common symbols and the description thereof is quoted.

The information processing device 1 according to the present embodiment includes a measurement system 2b (FIG. 5) in place of the measurement system 2 (FIG. 2). The measurement system 2b includes a resistance unit 20b in place of the resistance unit 20 (FIG. 2).

The resistance unit 20b includes a variable resistor 26-v. The variable resistor 26-v is a resistor whose resistance value can be set to any one of at least two resistance values. The variable resistor 26-v includes a first current terminal, a second current terminal, a control terminal, a resistance element and a movable part (not shown), for example. The first current terminal and the second current terminal are connected to the power supply unit 12 and the component 40, respectively. In addition, the control terminal is connected to the CPU 151.

The resistance element is sandwiched between the first current terminal and the second current terminal. Therefore, the variable resistor 26-v has a resistance value that is proportional to the path length of the resistance element between the first current terminal and the second current terminal. The movable part can vary the path length between the first current terminal and the second current terminal in accordance with a control signal that is input to the control terminal. A shape of the resistance element may be any of linear, arc, and helical. By presetting a relationship between voltage values of an arc control signal and the path length, the resistance unit 20b can achieve a resistance value corresponding to the voltage value of the control signal. For example, when the voltage value of the control signal is a high voltage value or a low voltage value, the resistance value of the resistance unit 20b can be set to R1 or R2, respectively. Thus, when the operation mode of the CPU 151 is the standard mode or the sleep mode, the resistance value of the variable resistor 26-v is R1 or R2, respectively. In addition, the first current terminal and the second current terminal are connected to an input end I and an output end O of the measurement unit 30, respectively. The measurement unit 30 therefore can measure a voltage drop that is generated across the variable resistor 26-v.

Figure 5:
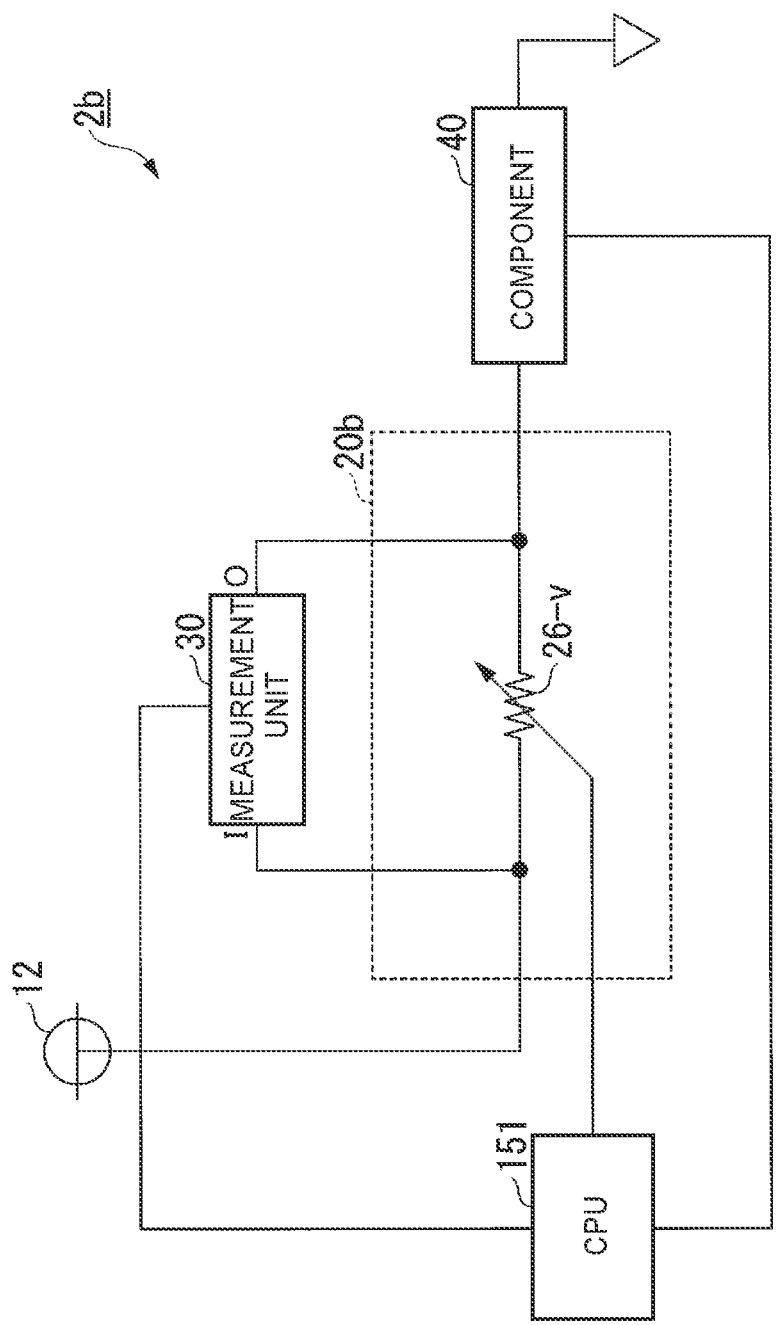
FIG. 5 is a schematic block diagram illustrating a configuration example of a measurement system according to the third embodiment.

According to the structure illustrated in FIG. 5, it is thus unnecessary to include a plurality of resistors whose resistance values are different, and a switch unit for energizing a resistor to be measured. In addition, the measurement unit 30 is not required to have a measurement channel for every resistor or select a measurement channel in accordance with the resistor to be measured. It is therefore possible to make the circuit configuration simple.

Modified Example

Next, a modified example of the above-described embodiment will be described.

Figure 6:
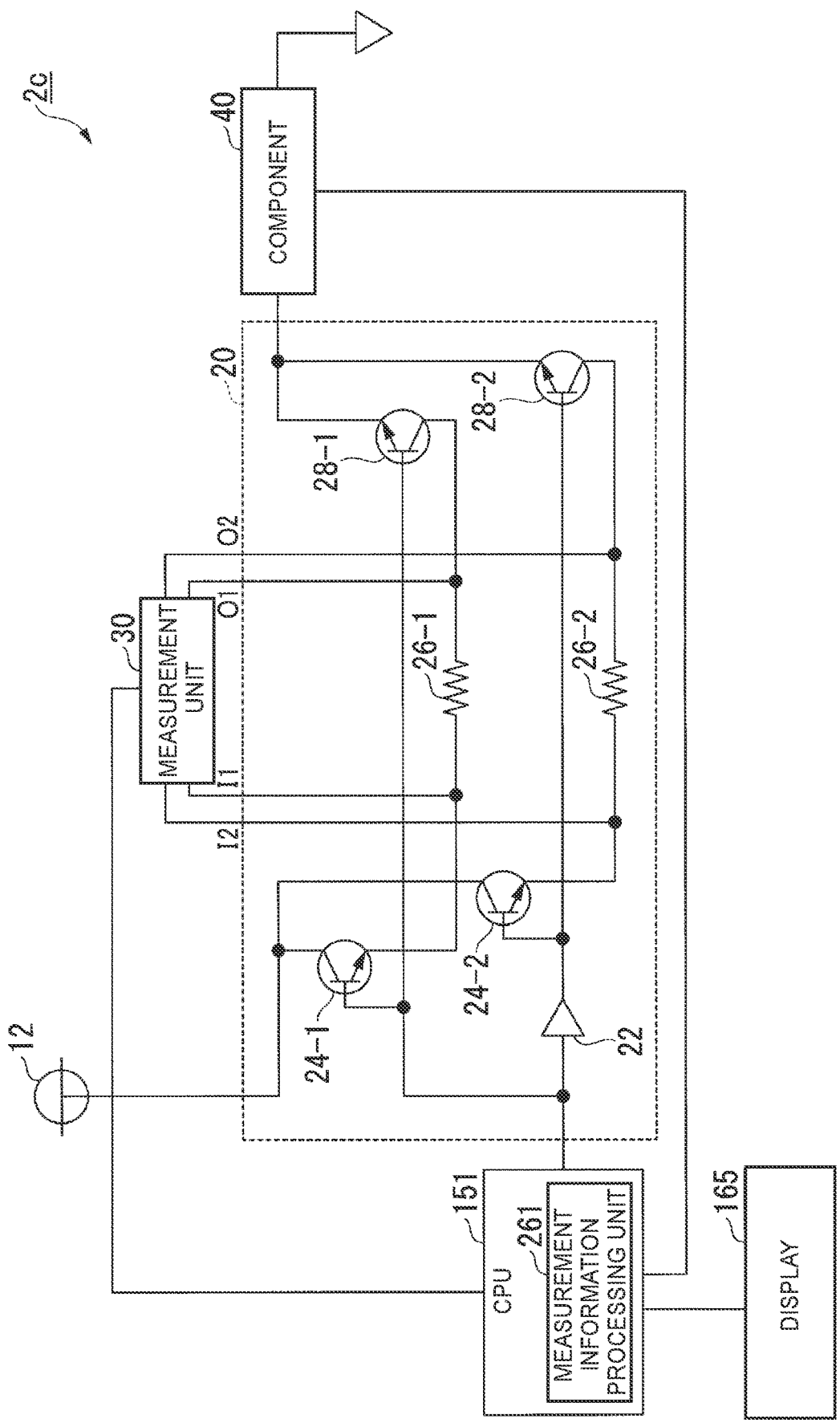
FIG. 6 is a schematic block diagram illustrating a modified example of the measurement system according to the first embodiment.

FIG. 6 illustrates a modified example of the measurement system 2 according to the above-described embodiment. Although the modified example illustrated in FIG. 6 is a modified example of the measurement system 2 according to the first embodiment, other embodiments may be modified similarly.

The CPU 151 executes a predetermined application program and performs a function as a measurement information processing unit 261. The measurement information processing unit 261 generates notification screen data for displaying measurement information that is input from the measurement unit 30. For example, the measurement information processing unit 261 may generate notification screen data with the measurement information superimposed at a predetermined position in a notification screen template having a predetermined layout. The measurement information processing unit outputs the generated notification screen data to the display 165 via the GPU 153. The display 165 functions as a notification unit for notifying a user of the measurement information.

The measurement information processing unit 261 may determine whether or not the power consumption that is indicated by the measurement information has become an abnormal value. Values that are considered abnormal are typically different in accordance with the type of individual component 40. For example, when the component 40 is the communication module 159 for wireless communication, it is 0.5 W or more, or 10 mW or less. When the measurement information processing unit 261 determines that the power consumption has fallen within a range considered to be abnormal, it may display the measurement information in the notification screen data in a display form different from the case within the range of the normal value. The display form is any of elements such as color, brightness, width, size, and decoration, or a combination thereof. For example, the abnormal value may be displayed in a more prominent form than the normal value to easily remind a user of an abnormal operating state.

When the power consumption is larger than an upper limit value of predetermined normal values, the measurement information processing unit 261 may restart the component 40. At this time, the measurement information processing unit 261 outputs a reset signal to the component 40. The component 40 stops its operation when the reset signal is received from the measurement information processing unit 261, and then restarts.

When the power consumption is larger than the upper limit value of predetermined normal values, the measurement information processing unit 261 may stop the operation of the component 40. The measurement information processing unit 261 may output a predetermined inquiry screen on the display 165 before stopping the operation. The measurement information processing unit 261 may stop the operation of the component when an operation signal for instructing a stop of the operation is input from the input device 177.

Figure 4:
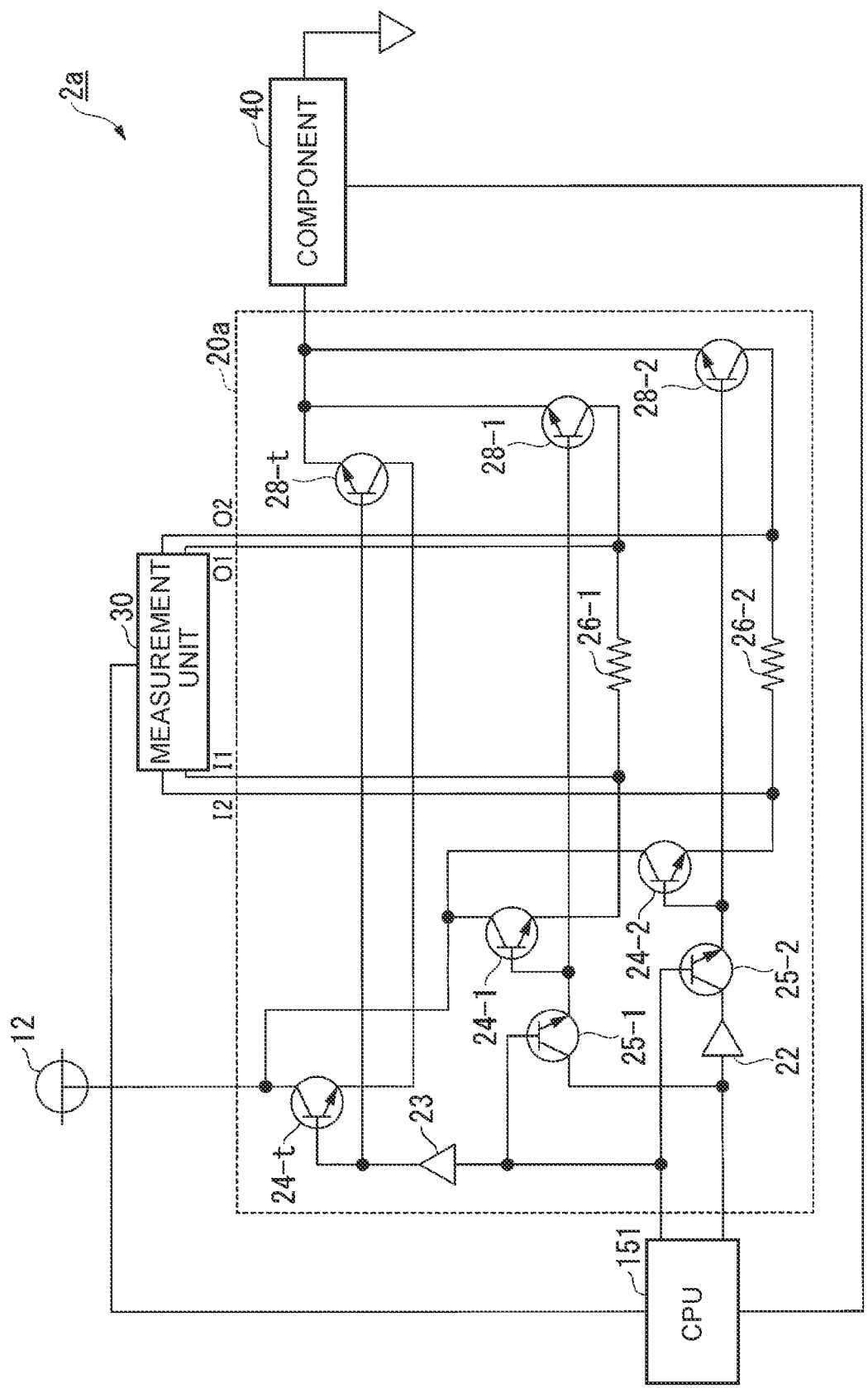
FIG. 4 is a schematic block diagram illustrating a configuration example of a measurement system according to the second embodiment.

Note that although there is only one component 40 to be measured in the examples shown in FIGS. 2, 4, and 5, there may be a plurality of components 40. In that case, there may be one resistance unit 20 whose resistance value is variable for each individual component 40. In addition, as long as the measurement unit 30 can independently measure an electric effect that is produced in the individual resistance unit 20, the number of the measurement units 30 does not have to be plural.

In addition, although FIG. 1 illustrates the case where a processor that functions as a control unit for controlling the operation of the information processing device 1 is one CPU 151 and one GPU 153 each, this is not essential. There may be a plurality of CPUs 151 and GPUs 153, respectively. In addition, the GPU 153 may be omitted.

Furthermore, in the examples shown in FIGS. 2, 4, and 6, the switch units 24-1, 24-2, 24-t, 25-1, 25-2, 28-1, 28-2, and 28-t are NPN type transistors, but this is not essential. The switch units 24-1, 24-2, 24-t, 25-1, 25-2, 28-1, 28-2, and 28-t may be a switch element whose operating principle is different, including an electromagnetic relay or a thyristor, as long as they can control whether or not to energize in response to a control signal or a measurement control signal.

As described above, the information processing device 1 according to the present embodiment includes the component 40 that performs a predetermined operation, the resistance unit 20 having a variable resistance value, and the measurement unit 30 that measures a voltage drop in the resistance unit 20. The resistance unit 20 is connected on an electric power line that supplies electric power to the component 40.

Since this structure makes the voltage drop in the resistance unit 20 that is generated by the electric power to the component 40 variable, it is possible to make the range of voltage drop values variable depending on the operating condition of the component 40.

In addition, the information processing device 1 further includes a control unit (for example, the CPU 151) configured to control the operation of the information processing device, the control unit having a first operating state (for example, the standard mode) and a second operating state (for example, the sleep mode) in which power consumption is lower than in the first operating state. The resistance unit 20 makes its resistance value larger when the operating state of the control unit is the second operating state than that when the operating state is the first operating state.

When the power consumption of the control unit is low, the operation of the component tends to become inactive. However, it is possible to increase the value of the voltage drop that is generated in the resistance unit 20 as the operation becomes more inactive, and decrease the value of the voltage drop that is generated in the resistance unit 20 as the operation becomes more active. Thus, it is possible to avoid the reduction in accuracy due to the value of the voltage drop being too small when in the second inactive operating state. Similarly, it is possible to avoid a failure in the operation of the component 40 due to the value of the voltage drop being too large when in the first active operating state.

In addition, the resistance unit 20 may include the first resistor 26-1, the second resistor 26-2 whose resistance value is larger than that of the first resistor 26-1, and the switch units 24 and 28 that energize any one of the first resistor 26-1 and the second resistor 26-2. The resistance unit 20 energizes the first resistor 26-1 when the operating state of the control unit is the first operating state and energizes the second resistor 26-2 when the operating state of the control unit is the second operating state.

This structure can make the resistance value of the resistance unit 20 variable using the members including the general-purpose resistors 26-1 and 26-2, and the switch units 24 and 28. Thus, it is possible to economically avoid the reduction in measurement accuracy of the voltage drop and the failure in the operation of the component 40.

In addition, the control unit may short-circuit the resistance unit 20 when a voltage drop is not measured. Since no electric resistance is generated in the resistance unit 20 when a voltage drop is not measured, this structure can reduce power consumption due to electric resistance.

In addition, the information processing device 1 further includes a measurement information notification unit 265 that notifies of measurement information on a voltage drop. This structure makes it possible for a user to grasp the operating state of the component 40 more accurately since measurement information (for example, power consumption) based on the voltage drop measured with higher accuracy is notified.

Although the embodiments of the present invention have been described in detail with reference to the drawings, specific structures are not limited to the above-described embodiments and design etc. without departing from the scope of the invention is also included. Each structure described in the above-described embodiments can be combined optionally.

DESCRIPTION OF SYMBOLS 1 information processing device
2, 2a, 2b, 2c measurement system
12 power supply unit
20, 20a, 20b, 20c resistance unit
22 voltage regulator
23 inverter
24 (24-1, 24-2, 24-t), 25 (25-1, 25-2), 28 (28-1, 28-2, 28-t) switch unit
26 (26-1, 26-2) resistor
26-v variable resistor
30 measurement unit
40 component
151 CPU
165 display

What is claimed is:

1. An information processing device, comprising:
a component;
a resistance unit including a variable resistance value;
a measurement unit that measures a voltage drop of the resistance unit; and
a control unit configured to control operation of the information processing device, the control unit including a first operating state and a second operating state,
wherein:
the resistance unit is connected on an electric power line for supplying electrical power to the component, and
when the control unit is operating in the second operating state, the resistance unit is configured to provide a first resistance value larger than a second resistance value provided when the control unit is operating in the first operating state.

2. The information processing device of claim 1, wherein: power consumption of the control unit in the second operating state is lower than power consumption in the first operating state.

3. The information processing device of claim 1, wherein the control unit includes one or more processors.

4. The information processing device of claim 1, wherein the resistance unit comprises:
a first resistor,
a second resistor including a resistance value higher than a resistance value of the first resistor; and
a switch unit configured to direct electrical power through any one of the first resistor and the second resistor,
wherein the resistance unit is configured to direct electrical power through the first resistor when the control unit is operating in the first operating state and direct electrical power through the second resistor when the control unit is operating in the second operating state.

5. The information processing device of claim 1, wherein:
the resistance unit comprises a variable resistor; and
the resistance unit is configured to adjust the variable resistor to a first resistance value when the control unit is operating in the first operating state and adjust the variable resistor to a second resistance value when the control unit is operating in the second operating state.

6. The information processing device of claim 5, wherein the control unit adjusts a range of resistance values of the variable resistor based on the operating condition of the component.

7. The information processing device of claim 1, further comprising a switch unit controlled by the control unit that bypasses the variable resistance value.

8. The information processing device of claim 1, further comprising a measurement information processing unit that reports measurement information obtained from the measurement unit.

9. The information processing device of claim 8, wherein the measurement information processing unit reports measurement information obtained from the measurement unit in response to detecting that the measurement information is outside of a predefined range.

10. A control method for an information processing device, comprising:
providing electric power to a component via an electric power line;
adjusting a resistance unit located on the electric power line that includes a variable resistance value based on an operating state of a control unit that controls operation of the information processing device; and measuring a voltage drop of the resistance unit with a measurement unit, wherein adjusting the resistance unit located on the electric power line that includes the variable resistance value based on the operating state of the control unit that controls operation of the information processing device comprises:

in response to the control unit entering the first operating state, adjusting the resistance unit to provide a first resistance value, and in response to the control unit entering the second operating state, adjusting the resistance unit to provide a second resistance value larger than the first resistance value.

11. The method of claim 10, wherein:

power consumption of the control unit in the second operating state is less than power consumption in the first operating state.

12. The method of claim 10, wherein the control unit includes one or more processors.

13. The method of claim 10, wherein adjusting the resistance unit based on the operating state of the control unit further comprises:

directing electrical power through a first resistor of the resistance unit in response to the control unit entering the first operating state; and directing electrical power through a second resistor of the resistance unit in response to the control unit entering the second operating state.

14. The method of claim 10, wherein adjusting the resistance unit based on the operating state of the control unit further comprises:

adjusting the value of a variable resistor to the first resistance value in response to the control unit entering the first operating state; and adjusting the value of the variable resistor to the second resistance value in response to the control unit entering the second operating state.

15. The method of claim 14, further comprising adjusting a range of resistance values of the variable resistor based on the operating condition of the component.

16. The method of claim 10, further comprising:

bypassing any resistive elements in the resistance unit in response to the control unit entering an operating state where measurement of the voltage drop of the resistance unit is not requested.

17. The method of claim 10, further comprising reporting measurement information obtained from the measurement unit.

18. The method of claim 17, wherein reporting measurement information obtained from the measurement unit comprises reporting measurement information obtained from the measurement unit in response to detecting that the measurement information is outside of a predefined range.

19. A computer program product comprising a non-transitory computer readable storage medium that stores code executable by a processor, the executable code comprising code causing the processor to:

provide electric power to a component via an electric power line;

adjust a resistance unit located on the electric power line that includes a variable resistance value based on an operating state of a control unit that controls operation of the information processing device; and measure a voltage drop of the resistance unit with a measurement unit wherein adjusting the resistance unit located on the electric power line that has the variable resistance value based on the operating state of the control unit that controls operation of the information processing device comprises:

in response to the control unit entering a first operating state, adjusting the resistance unit to provide a first resistance value, and in response to the control unit entering a second operating state, adjusting the resistance unit to provide a second resistance value larger than the first resistance value.

20. The computer program product of claim 19, wherein:

power consumption of the control unit in the second operating state is less than power consumption in the first operating state.

* * * * *